United States Patent

Kaneyama

[11] Patent Number: 5,952,656
[45] Date of Patent: Sep. 14, 1999

[54] ENERGY FILTER

[75] Inventor: Toshikatsu Kaneyama, Tokyo, Japan

[73] Assignee: JEOL Ltd., Tokyo, Japan

[21] Appl. No.: 08/982,718

[22] Filed: Dec. 2, 1997

[30] Foreign Application Priority Data

Dec. 3, 1996 [JP] Japan .................................. 8-322512

[51] Int. Cl.$^6$ .............................. G21K 3/00; G21K 1/08
[52] U.S. Cl. .................................. 250/305; 250/396 ML; 250/396 R; 250/311
[58] Field of Search .......................... 250/305, 396 ML, 250/396 R, 311

[56] References Cited

U.S. PATENT DOCUMENTS

| 4,740,704 | 4/1988 | Rose et al. ....................... 250/396 ML |
| 5,177,361 | 1/1993 | Krahl et al. ............................ 250/305 |
| 5,448,063 | 9/1995 | De Jong et al. ........................ 250/305 |
| 5,811,801 | 9/1998 | Tsuno ..................................... 250/305 |

Primary Examiner—Edward P. Westin
Assistant Examiner—Nikita Wells
Attorney, Agent, or Firm—Webb Ziesenheim Logsdon Orkin & Hanson, P.C.

[57] ABSTRACT

There is disclosed an Ω-filter for use with an electron microscope. This filter has only one parameter that controls the exciting currents supplied to four magnets $M_1$–$M_4$. Only those electrons of incident electrons that have a given energy pass through the successive magnets and emerge from the filter. The coils of the magnets $M_1$ and $M_4$ are identical in number of turns and connected in series. Similarly, the coils of the magnets $M_2$ and $M_3$ are identical in number of turns and connected in series. When a human operator specifies an exciting current $i_1$ through an entry device, a controller causes a power supply $P_1$ to produce this exciting current $i_1$, thus exciting the magnets $M_1$ and $M_4$. The controller calculates an exciting current $i_2$ from the exciting current $i_1$, and causes a power supply $P_2$ to produce this exciting current $i_2$, thus exciting the magnets $M_2$ and $M_3$.

7 Claims, 4 Drawing Sheets

ENERGY FILTER

FIELD OF THE INVENTION

The present invention relates to a transmission type energy filter such as an omega-type energy filter or alpha-type energy filter for use with a transmission electron microscope and, more particularly, to control of exciting currents supplied to magnets forming such an energy filter.

BACKGROUND OF THE INVENTION

An omega-type energy filter ($\Omega$-filter) or alpha-type energy filter ($\alpha$-filter) is combined with a transmission electron microscope and used to create an image from only electrons of a certain energy contained in an electron beam that have passed through a specimen.

FIG. 6 shows a conventional structure of an $\Omega$-filter. This filter is composed of four magnets $M_1$, $M_2$, $M_3$, and $M_4$ that are excited with currents $i_1$, $i_2$, $i_3$, and $i_4$, respectively, supplied from power supplies $P_1$, $P_2$, $P_3$, and $P_4$, respectively.

The direction of the magnetic fields produced by the magnets $M_1$ and $M_4$ is vertical to the plane of the paper and directed downward (indicated by ). The direction of the magnetic fields developed by the magnets $M_2$ and $M_3$ are vertical to the plane of the paper and directed upward (indicated by $\odot$). The center orbits drawn by electrons having a certain energy (velocity v) in passing through the magnets $M_1$, $M_2$, $M_3$, and $M_4$ have radii $r_1$, $r_2$, $r_3$, and $r_4$, respectively. This $\Omega$-filter is inserted in the imaging lens system of an electron microscope. Electrons transmitted through the specimen and having different energies enter the $\Omega$-filter. Of these electrons, only those having a certain energy pass through the filter and are returned to the imaging lens system. The radius $r_1$ of the orbit is given by $$r_1 = mv/eB_1 \quad (1)$$

where m is the mass of the electron, v is the velocity of the electron, e is the charge of the electron, and $B_1$ is the magnetic flux density of the magnetic field produced by the magnet $M_1$. Similar relations hold for the radii $r_2$, $r_3$, and $r_4$ of the other orbits. Let B the magnetic flux density of the magnetic field produced by each magnet. As is well known in the art, this magnetic flux density is given by $$B = \mu Ni/D \quad (2)$$

where $\mu$ is the permeability of vacuum, N is the number of turns, i is the exciting current, and D is the gap in the magnet.

In the structure shown in FIG. 6, it is assumed that the magnets $M_1$, $M_2$, $M_3$, and $M_4$ are identical in gap length. Exciting currents supplied to the coils are given by $$i_1 = T/r_1 N_1 \quad (3)$$

$$i_2 = T/r_2 N_2 \quad (4)$$

$$i_3 = T/r_3 N_3 \quad (5)$$

$$i_4 = T/r_4 N_4 \quad (6)$$

Thus, only the electrons that are contained in the incident electron beam and have a certain energy (velocity v) move in an orbit O like the letter $\Omega$ and emerge as outgoing electrons. In Eqs. (3)–(6) above, T is a common coefficient determined by the velocity v of the electrons moving in the orbit 0 and by the gap length D of the magnets $M_1$, $M_2$, $M_3$, and $M_4$, and is given by $$T = mvD/e\mu \quad (7)$$

where $\mu$ is the permeability of vacuum. $N_1$, $N_2$, $N_3$, and $N_4$ are the numbers of turns of the coils of the magnets $M_1$, $M_2$, $M_3$, and $M_4$, respectively.

FIG. 7 shows an example of $\alpha$-filter configuration. The illustrated $\alpha$-filter is equipped with three magnets $M_{11}$, $M_{12}$, and $M_{13}$, which are excited with currents $i_{11}$, $i_{12}$, and $i_{13}$, respectively, supplied from power supplies $P_{11}$, $P_{12}$, and $P_{13}$, respectively. Magnetic fields produced by these three magnets $M_{11}$, $M_{12}$, and $M_{13}$ are all directed vertically downward from the plane of the paper.

In this structure, only the electrons of the incident electron beam having a certain energy (velocity v) move in a substantially $\alpha$-shaped orbit O and leave the filter. The center orbits described by the electrons having the certain energy (velocity v) in passing through the magnets $M_{11}$, $M_{12}$ and $M_{13}$ have radii $r_{11}$, $r_{12}$, and $r_{13}$, respectively.

In the prior art $\Omega$-filter, one power supply is provided for each one magnet as shown in FIG. 6. Where electrons having a certain energy (velocity v) are selected, the operator must adjust the 4 power supplies to satisfy Eqs. (3)–(6) above. These operations are very cumbersome and laborious to perform. The $\alpha$-filter has similar disadvantages. That is, the operator normally must adjust the exciting currents fed to the three magnets so that electrons of a certain energy (velocity v) pass through the magnets.

SUMMARY OF THE INVENTION

The present invention is intended to solve the foregoing problems.

It is an object of the present invention to provide an energy filter having one parameter that can determine exciting currents supplied to all magnets.

This object is achieved in accordance with the teachings of the invention by an energy filter comprising a plurality of magnets for causing electrons having a certain energy (velocity v) to execute an orbit like the letter $\Omega$ or the letter $\alpha$. This energy filter has one parameter corresponding to the energy (velocity v) of the electrons describing the orbit described above. This parameter determines exciting currents supplied to all the magnets.

Other objects and features of the invention will appear in the course of the description thereof, which follows.

DESCRIPTION OF THE PREFERRED EMBODIMENTS

Figure 6:
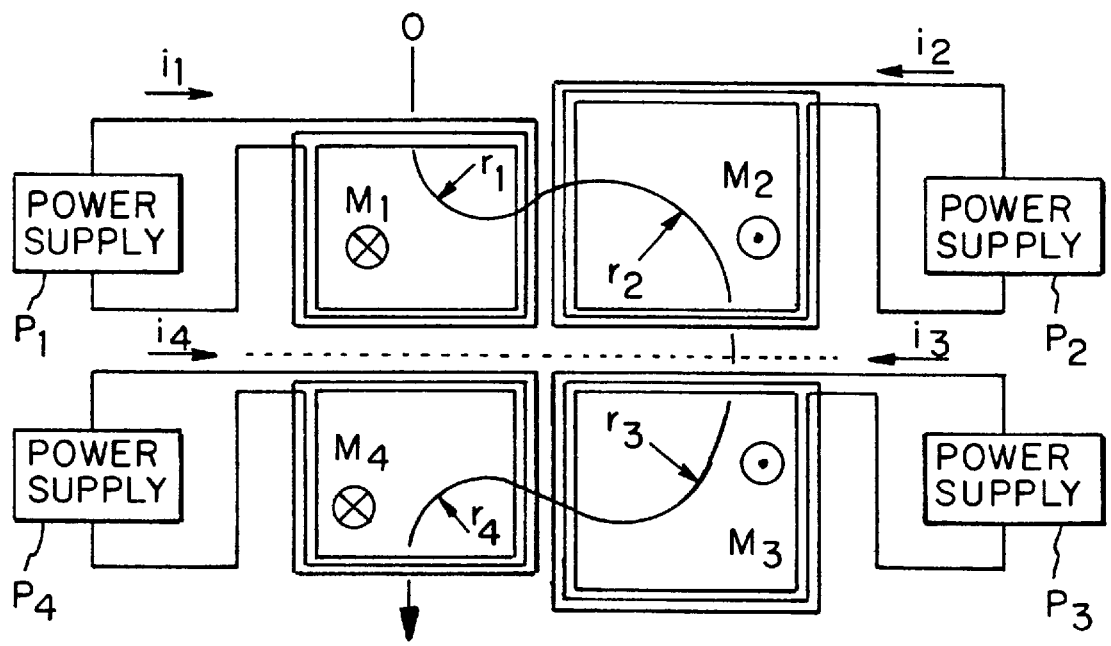
FIG. 6 is a diagram of the prior art $\Omega$-filter.

Before describing the preferred embodiments of the present invention, the theory underlying the inventive concept is described. In FIG. 6, electrons move in an orbit O within an Ω-filter. In order that the orbit of the outgoing electrons be coincident with the orbit of the incident electrons, it is necessary that the orbit O in the Ω-filter be vertically symmetrical with respect to the broken line. That is, the following two relations need to be satisfied:

$$r_1 = r_4 \quad (8)$$

$$r_2 = r_3 \quad (9)$$

From Eqs. (3) and (6), it can be seen that the relationship $i_1 = i_4$ holds if $N_1 = N_4$. Similarly, the relation $i_2 = i_3$ is derived from Eqs. (4) and (5) if $N_2 = N_3$.

Figure 1:
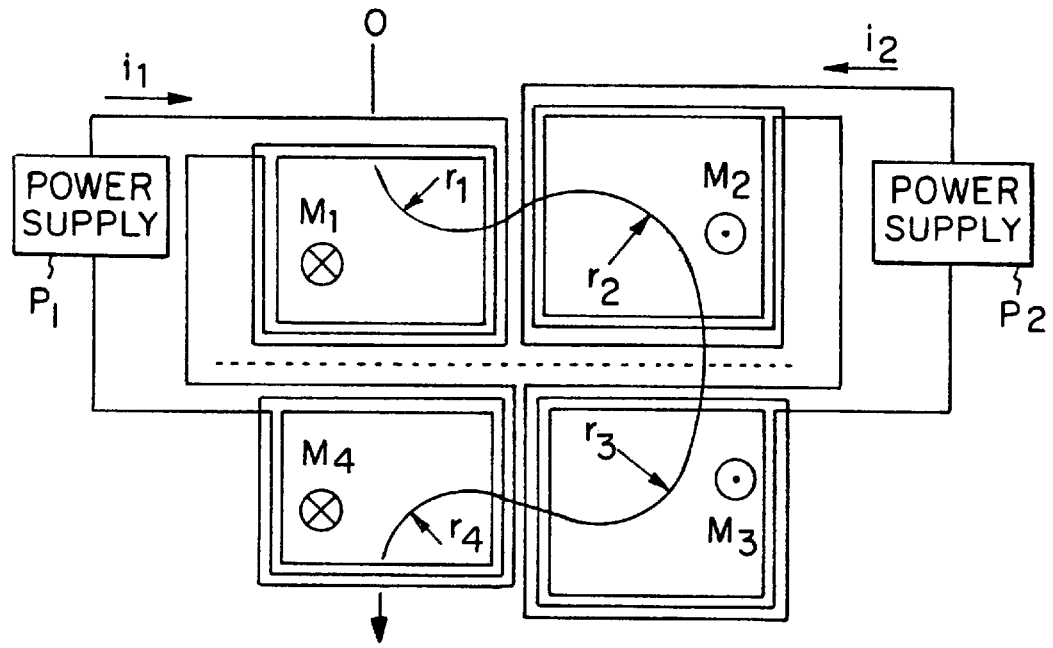
FIG. 1 is a diagram of an $\Omega$-filter illustrating the principle of the present invention, the filter having two power supplies.

Referring still to FIG. 6, suppose that the number of turns $N_1$ of the coil on a magnet $M_1$ is equal to the number of turns $N_4$ of the coil on a magnet $M_4$. These two coils are connected in series. Similarly, it is assumed that the number of turns $N_2$ of the coil on a magnet $M_2$ is equal to the number of turns $N_3$ of the coil on a magnet $M_3$. These two coils are also connected in series. As a result, the four magnets can be excited by the two power supplies, as shown in FIG. 1. Accordingly, the selected energy (velocity v) of electrons can be modified by adjusting the exciting currents $i_1$ and $i_2$ from the power supplies $P_1$ and $P_2$, respectively. That is, parameters that should be adjusted are two in number. Exciting currents $i_1$ and $i_2$ supplied from the power supplies $P_1$ and $P_2$ are given by $$i_1 = T/r_1 N_1 \quad (10)$$

$$i_2 = T/r_2 N_2 \quad (11)$$

Although the number of parameters adjusted to alter the selected energy (velocity v) of electrons can be reduced to 2 in the configuration of FIG. 1, it is still cumbersome to separately adjust the two power supplies $P_1$ and $P_2$. Therefore, we contemplate reducing the number of parameters down to one in the manner described below.

As mentioned previously, in order to bring the orbit of the outgoing electrons into agreement with the orbit of the incident electrons, the relations $r_1 = r_4$ and $r_2 = r_3$ must be met. The ratio of $r_1$ to $r_2$, or $$r_1/r_2 = p \quad (12)$$

is one of the important constants determining the characteristics of the filter and set to an optimum value after careful considerations.

If all the magnets $M_1$, $M_2$, $M_3$, and $M_4$ have the same gap length, Eqs. (1) and (12) lead to $$p = B_2/B_1 \quad (13)$$

where $B_1$ and $B_2$ are the magnetic flux densities of magnetic fields produced by the magnets $M_1$ and $M_2$, respectively. Taking account of Eq. (2), we have $$p = N_2 \cdot i_2 / N_1 \cdot i_1 \quad (14)$$

Furthermore, from Eqs. (1), (2), (8), and (9), we have $$N_3 \cdot i_3 = N_2 \cdot i_2 \quad (15)$$

$$N_4 \cdot i_4 = N_1 \cdot i_1 \quad (16)$$

Note that the current $i_1$ is obtained from Eq. (3). From Eq. (14), we have $$i_2 = p \cdot i_1 \cdot N_1 / N_2 \quad (17)$$

Obviously, $N_1$, $N_2$, and p are values intrinsic in this Ω-filter.

To simplify the equation, we assume that the following relation holds:

$$p' = p N_1/N_2 \quad (18)$$

Then, $i_2$ is uniquely determined by $$i_2 = i_1 \cdot p' \quad (19)$$

It can be seen from this equation that with respect to the selected energy (velocity v) of electrons, once the exciting current $i_1$ for the magnets $M_1$ and $M_4$ is determined, the exciting current $i_2$ for the magnets $M_2$ and $M_3$ is uniquely determined correspondingly. That is, it is possible that the parameter to be controlled is only the current $i_1$.

Figure 2:
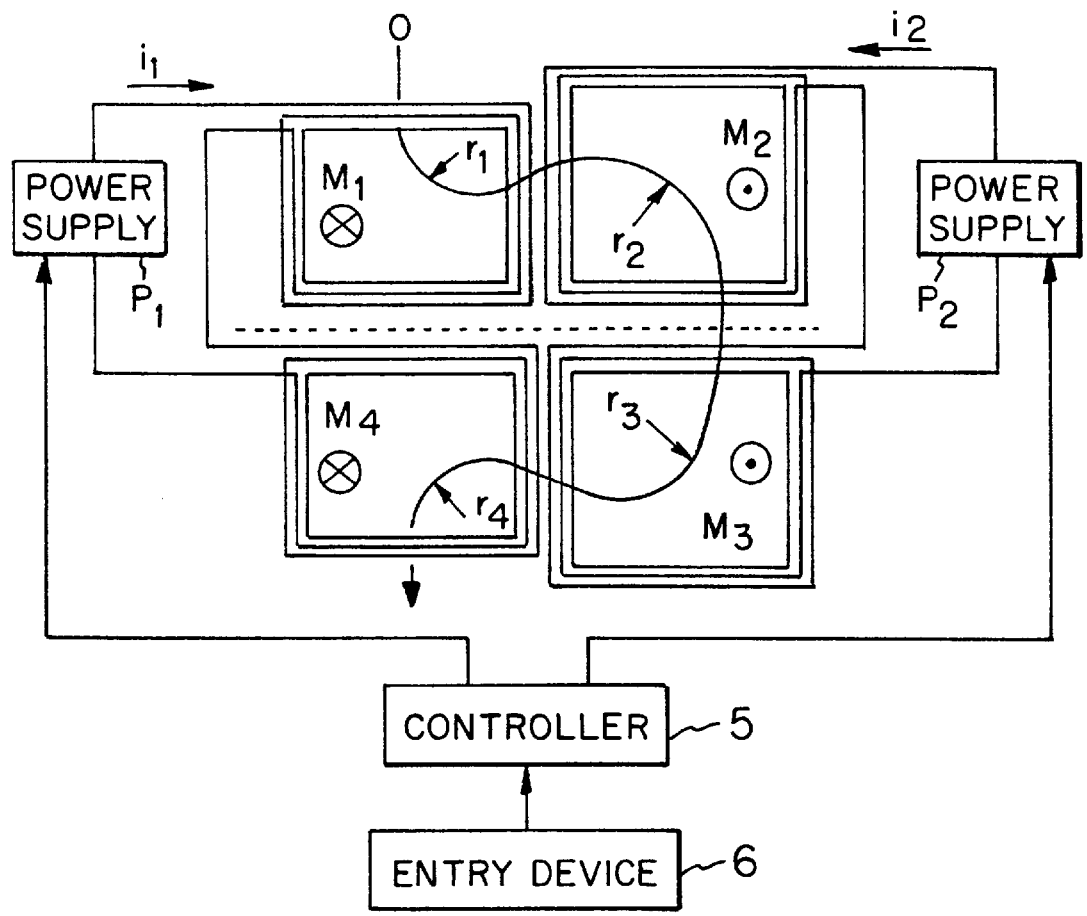
FIG. 2 is a diagram of an $\Omega$-filter in accordance with the invention.

FIG. 2 shows an Ω-filter embodying the concept of the present invention. In FIG. 2, a controller 5 consists of a processing unit including a computer. An entry device 6 includes a keyboard and control knobs. The other components are the same as shown in FIG. 1. In particular, the number of turns $N_1$ of the coil of the magnet $M_1$ is the same as the number of turns $N_4$ of the coil of the magnet $M_4$, and these two coils are connected in series. Likewise, the number of turns $N_2$ of the coil of the magnet $M_2$ is equal to the number of turns $N_3$ of the coil of the magnet $M_3$, and these coils are connected in series.

In FIG. 2, if the operator operates the entry device 6 to enter the exciting current $i_1$ to be produced from the power supply $P_1$, the controller 5 informs the power supply $P_1$ of the entered exciting current $i_1$ and calculates the exciting current $i_2$, using Eq. (17) the controller 5 informs the power supply $P_1$ of the entered exciting current $i_1$ and calculates the exciting current $i_2$, using Eq. (17) or (19). The result is sent to the power supply $P_2$. Thus, the power supply $P_1$ produces the exciting current $i_1$ to the coils of the magnets $M_1$ and $M_4$. The power supply $P_2$ produces the exciting current $i_2$ to the magnets $M_2$ and $M_3$. Consequently, electrons having velocity v (energy) pass through the filter and enter the imaging lens system of the electron microscope, the velocity v being given by $$v = e \cdot \mu \cdot i_1 \cdot r_1 \cdot N_1 / mD = e \cdot \mu \cdot i_2 \cdot r_2 \cdot N_2 / mD \quad (20)$$

When the operator specifies the exciting current $i_1$, the energy E of electrons determined by the specified exciting current is preferably calculated from $E = mv^2/2$ and from Eq. (20) by the controller 5 and displayed, because the operator can readily recognize a selected energy corresponding to the specified exciting current.

In the above embodiment, the exciting current $i_1$ is specified. It can be seen from the above equation that it is also possible to specify the exciting current $i_2$ and then to determine the exciting current $i_1$ from $i_2$.

It is also possible for the operator to operate the entry device 6 so as to specify the energy E selected by the filter. In this case, the controller 5 converts the specified energy E into the exciting current $i_1$, using the relation $E = mv^2/2$ and Eq. (20), finds the exciting current $i_2$, and informs the power supplies in specifying the exciting currents fed to the coils of the magnets. In consequence, the adjustment is made quite easy.

Figure 3:
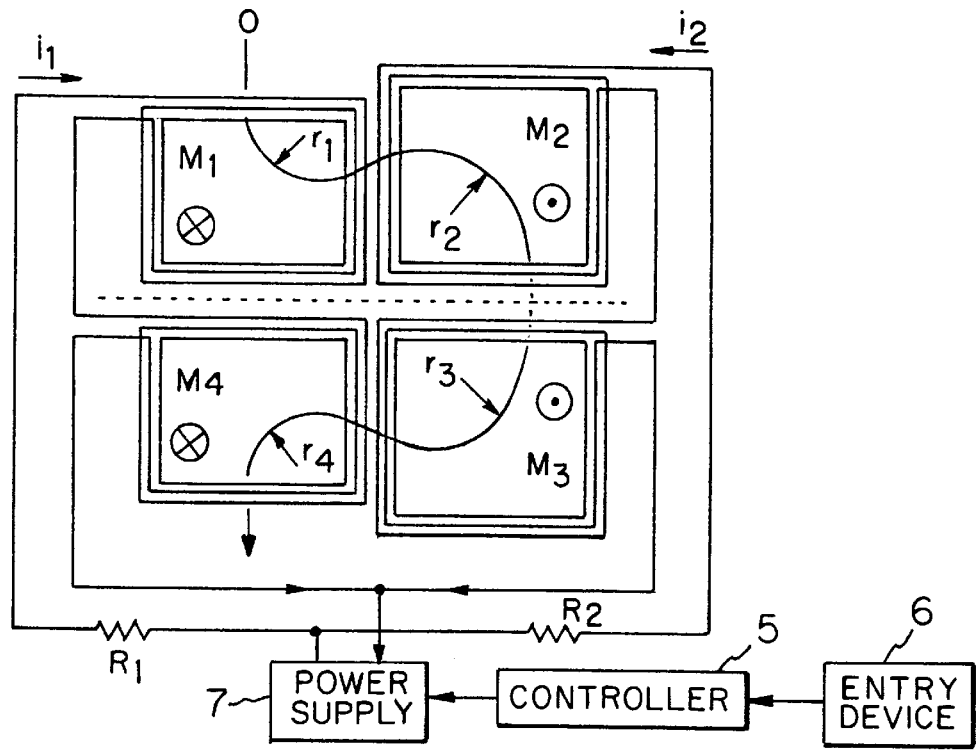
FIG. 3 is a diagram of another $\Omega$-filter in accordance with the invention.

Referring next to FIG. 3, there is shown another embodiment of the invention. The illustrated instrument is similar to the instrument shown in FIG. 2 except that resistors $R_1$ and $R_2$ are added to set the exciting currents $i_1$ and $i_2$, respectively. There exists only one power supply 7. The output current from the power supply 7 is split into the exciting currents $i_1$ and $i_2$ by the resistors $R_1$ and $R_2$, which are so set that the following relation is catered for:

$$(R_A+R_1)/(R_B+R_2)=p' \quad (21)$$

where $R_A$ is the sum of the resistance of the coil of the magnet $M_1$ and the resistance of the coil of the magnet $M_4$, and $R_B$ is the sum of the resistance of the coil of the magnet $M_2$ and the resistance of the coil of the magnet $M_3$.

In this structure, if the exciting current $i_1$ is entered from the entry device 6, the controller 5 causes the power supply 7 to produce an exciting current $(i_1+i_1 \cdot p')$. This exciting current from the power supply 7 is distributed to the two circuits connected in parallel according to their respective resistances and according to the Ohm's law. That is, the exciting current $i_1$ is supplied to the coils of the magnets $M_1$ and $M_4$. The exciting current $i_2$ given by $$i_2=i_1 \cdot p' \quad (22)$$

is furnished to the coils of the magnets $M_2$ and $M_3$. Consequently, electrons having an energy (velocity v) corresponding to the exciting currents $i_1$ and $i_2$ can move in the Ω-shaped orbit O shown in FIG. 3 and emerge from the filter.

Figure 4:
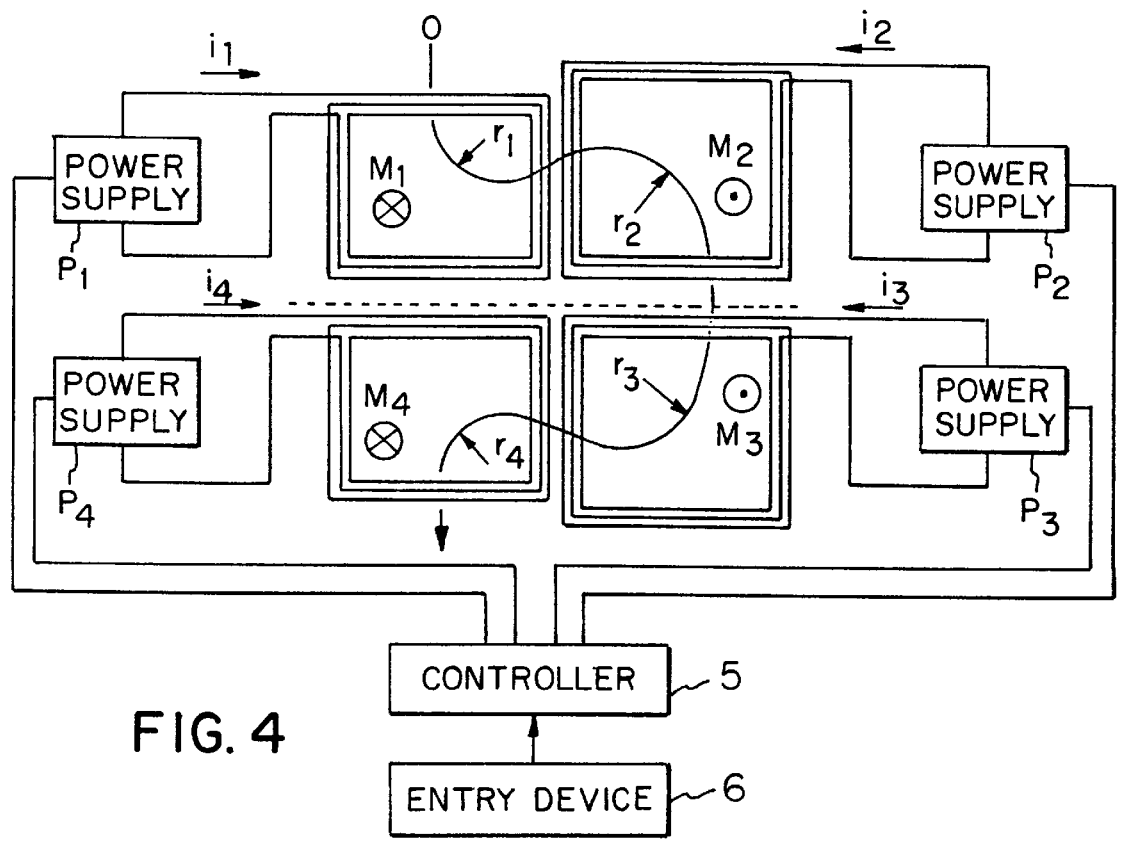
FIG. 4 is a diagram of a further $\Omega$-filter in accordance with the invention.

Referring next to FIG. 4, there is shown a further embodiment of the invention. The illustrated instrument is similar to the instrument shown in FIG. 2 except that exciting currents are supplied to the magnets $M_1$–$M_4$, respectively, of the Ω-filter from four power supplies $P_1$–$P_4$, respectively. The output currents from the power supplies are controlled by the controller 5.

The operator first operates the entry device 6 to key in the exciting current $i_1$ in the same way as in the embodiment described already in connection with FIG. 2. The controller 5 informs the power supplies $P_1$ and $P_4$ of the entered exciting currents $i_1$, computes the exciting current $i_2$, using Eq. (17), and informs the power supplies $P_1$ and $P_4$ of the result. Therefore, the exciting currents $i_1$ is supplied to the magnets $M_1$ and $M_4$ from the power supplies $P_1$ and $P_4$. The exciting current $i_2$ is fed to the magnets $M_2$ and $M_3$ from the power supplies $P_2$ and $P_3$. As a result, electrons having an energy (velocity v) corresponding to the exciting currents $i_1$ and $i_2$ can move in the Ω-shaped orbit O shown in FIG. 4 and pass the filter, in exactly the same way as in the embodiment described already in conjunction with FIG. 2.

While Ω-filters have been described thus far, an α-filter having such a single parameter can be similarly constructed that is capable of determining the exciting currents supplied to all the magnets.

Figure 5:
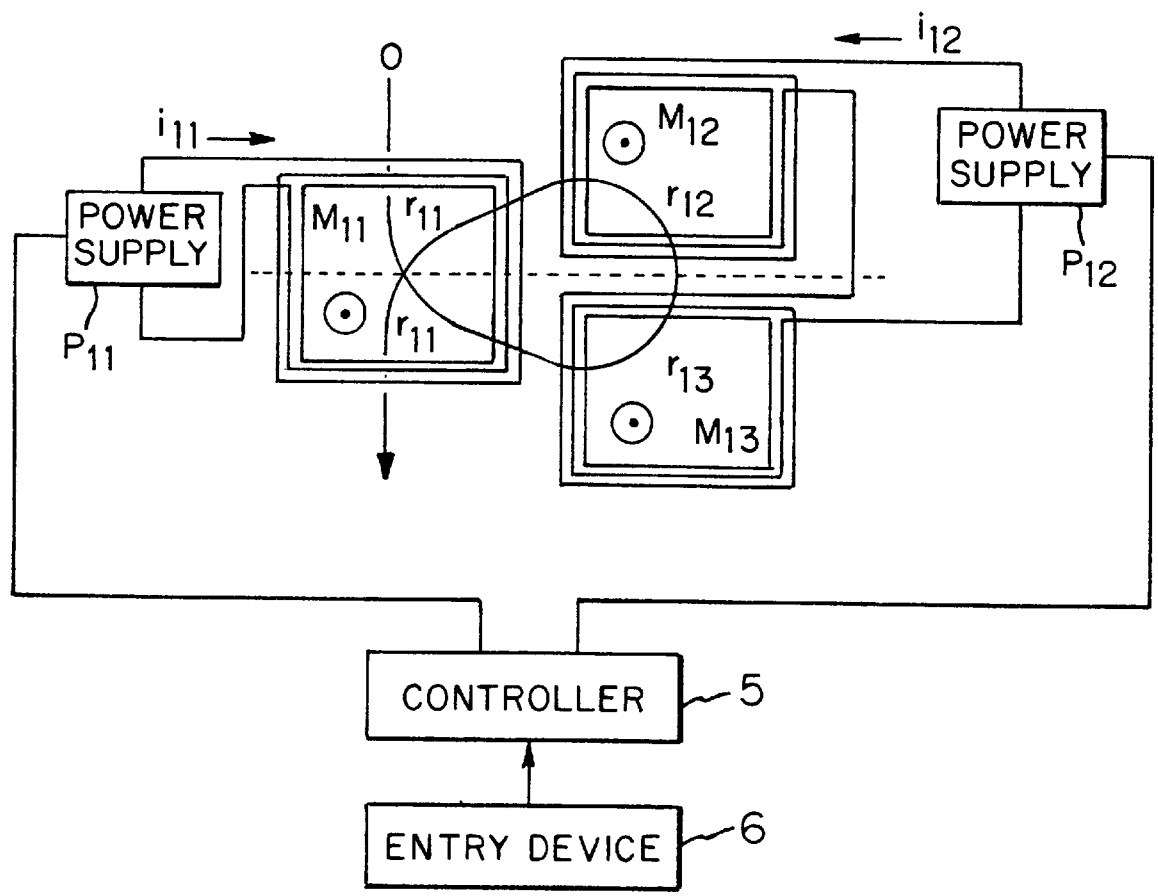
FIG. 5 is a diagram of an $\alpha$-filter in accordance with the invention.
Figure 7:
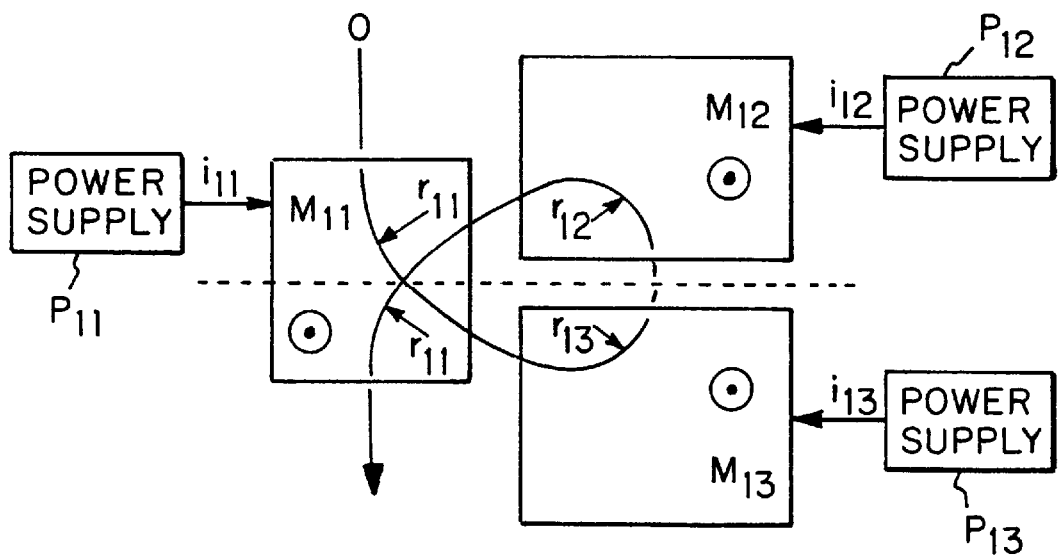
FIG. 7 is a diagram of the prior art $\alpha$-filter.

Referring next to FIG. 5, there is shown an α-filter embodying the concept of the invention. This filter is similar to the filters shown in FIGS. 2 and 7 except for points described below. In this α-filter, the electron orbit O needs to be vertically symmetrical with respect to the broken line. That is, the radius of orbit $r_{12}$ in the magnet $M_{12}$ must be equal to the radius of orbit $r_{13}$ in the magnet $M_{13}$, in the same manner as in the Ω-filter. If all the magnets $M_{11}$, $M_{12}$, and $M_{13}$ are equal in gap length, the relation between the exciting currents $i_{11}$ and $i_{12}$ ($=i_{13}$) can be found similarly to the equation derived in the case of the Ω-filter. That is, $$i_{12}=p \cdot i_{11} \cdot N_{11}/N_{12} \quad (23)$$

Where the energy (velocity v) of electrons selected is to be modified, if the exciting current $i_{11}$ to the magnet $M_{11}$ is determined, then the exciting current $i_{12}$ to the magnets $M_{12}$ and $M_{13}$ can be uniquely determined correspondingly. That is, only the single current $i_{11}$ can be selected as the parameter to be controlled.

While some embodiments of the present invention have been described, it is to be understood that the invention is not limited thereto. For example, various constructions are known as Ω- and α-filters. The invention can be applied to every construction of Ω- or α-filter. In the above embodiments, the exciting current supplied to the magnet defining the initial part of the electron orbit is used as the parameter. Instead, exciting currents supplied to other magnets may be employed. Furthermore, the parameter is not restricted to exciting currents. For instance, the energy (velocity v) is set to a desired value, and the controller 5 calculates the exciting current fed to the magnet from the set energy.

What is claimed is:

1. An energy filter comprising:
   a plurality of magnets for causing electrons having a given energy to execute an orbit of a given shape such as an Ω- or α-shaped orbit; and
   a single adjustment for selecting the energy of the electrons passing the filter and determining exciting current supplied to all of said magnets.

2. The energy filter of claim 1, further comprising a plurality of power supplies for exciting all of said magnets.

3. The energy filter of claim 2, wherein
   (A) said magnets are four in number and arranged one after another such that the electrons having said given energy move in a substantially Ω-shaped orbit,
   (B) said four magnets include a first magnet through which the electrons having said given energy initially pass,
   (C) said four magnets include a fourth magnet through which the electrons having said given energy finally pass,
   (D) a first and a fourth coils excite said first and fourth magnets, respectively,
   (E) said first and fourth coils are connected in series and supplied with an exciting current $i_1$ from a first one $P_1$ of said power supplies,
   (F) said four magnets include a second coil and a third coil for exciting said second and third magnets, respectively,
   (G) a second and a third coils are connected in series and supplied with an exciting current $i_2$ from a second one $P_2$ of said power supplies, and
   (H) there is also provided a control means when, when a human operator specifies one of said exciting currents $i_1$ and $i_2$, determines the other from the specified exciting current and causes said first and second power supplies, $P_1$ and $P_2$, to supply these exciting currents to the coils.

4. The energy filter of claim 2, wherein
   (A) said magnets are four in number and arranged one after another such that the electrons having said given energy move in a substantially Ω-shaped orbit,
   (B) coils for exciting said four magnets are connected with four separate power supplies, respectively,
   (C) said four magnets include a first magnet through which the electrons having said given energy initially pass,
   (D) said four magnets include a fourth magnet through which the electrons having said given energy finally pass,
   (E) said four magnets further include a second and a third magnets mounted between said first and fourth magnets,
   (F) said four coils include a first and a fourth coils for exciting said first and fourth magnets, respectively, (G) a control means controls said four power supplies so that said first and fourth coils are both supplied with an exciting current $i_1$ and that said second and third coils are both supplied with an exciting current $i_2$, and (H) when a human operator specifies one of said exciting currents $i_1$ and $i_2$, said control means determines the other from the specified exciting current.

5. The energy filter of claim 2, wherein (A) said magnets are four in number and arranged one after another such that the electrons having said given energy move in a substantially α-shaped orbit, (B) said four magnets include a first magnet through which the electrons having said given energy initially pass, (C) said four magnets include a fourth magnet through which the electrons having said given energy finally pass, said first and fourth magnets consisting of a common magnet, (D) a coil for exciting said common magnet is supplied with an exciting current $i_1$ from a power supply $P_1$, (E) said four magnets further include a second and a third magnets mounted between said first and fourth magnets, (F) said four coils include a second and a third coils for exciting said second and third magnets, respectively, (G) said second and third coils are connected in series and supplied with an exciting current $i_2$ from a power supply $P_2$, and (H) when a human operator specifies one of said exciting currents $i_1$ and $i_2$, said control means determines the other from the specified exciting current and causes said two power supplies $P_1$ and $P_2$ to supply the exciting currents to the coils.

6. The energy filter of claim 1, wherein one parameter corresponds to the energy of electrons executing the orbit of said given shape and determines all the exciting currents supplied to said magnets, and wherein a single power supply excites all the magnets via distributing resistors.

7. The energy filter of claim 6, wherein (A) said magnets are four in number and arranged one after another such that the electrons having said given energy move in a substantially Ω-shaped orbit, (B) said four magnets include a first magnet through which the electrons having said given energy initially pass, (C) said four magnets include a fourth magnet through which the electrons having said given energy finally pass, (D) said four magnets further include a second and a third magnets mounted between said first and fourth magnets, (E) a first and a fourth coils for exciting said first and fourth magnets, respectively, are connected in series to form a series combination of said first and fourth coils, (F) a second and a third coils for exciting said second and third magnets, respectively, are connected in series to form a series combination of said second and third coils, (G) said series combination of said first and fourth coils and said series combination of said second and third coils are connected in parallel with a common power supply, (H) said common power supply distributes its output current between the two series combinations of the coils such that the series combination of said first and fourth coils receives an exciting current $i_1$ and that the series combination of said second and third coils receives an exciting current $i_2$, and (I) when a human operator specifies one of said exciting currents $i_1$ and $i_2$, a control means determines the other from the specified exciting current and causes said power supply to produce an exciting current of $i_1+i_2$.

* * * * *

UNITED STATES PATENT AND TRADEMARK OFFICE
CERTIFICATE OF CORRECTION

PATENT NO. : 5,952,656
DATED : September 14, 1999
INVENTOR(S) : Toshikatsu Kaneyama It is certified that error appears in the above-identified patent and that said Letters Patent is hereby corrected as shown below:

Column 1 Line 24 "(indicated by )" should read
--(indicated by ⊗)--.

Column 8 Line 32, claim 7, "second and third" should read
--first and fourth--.

Signed and Sealed this

Second Day of May, 2000

*Attest:*

Q. TODD DICKINSON

*Attesting Officer*     *Director of Patents and Trademarks*